United States Patent
Hara et al.

(10) Patent No.: US 7,645,081 B2
(45) Date of Patent: Jan. 12, 2010

(54) COATING AND DEVELOPING APPARATUS, COATING AND DEVELOPING METHOD, AND STORAGE MEDIUM

(75) Inventors: Yoshitaka Hara, Koshi (JP); Shingo Katsuki, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 12/197,682

(22) Filed: Aug. 25, 2008

(65) Prior Publication Data

US 2009/0059187 A1 Mar. 5, 2009

(30) Foreign Application Priority Data

Aug. 28, 2007 (JP) .............................. 2007-221609

(51) Int. Cl.
*G03D 5/00* (2006.01)
*G03B 27/32* (2006.01)
*B65H 11/00* (2006.01)
*B05C 13/00* (2006.01)

(52) U.S. Cl. .................... 396/611; 355/27; 414/220.01; 414/940; 118/66

(58) Field of Classification Search ................. 396/611; 355/27; 414/221.01, 935, 940; 118/52, 58, 118/66

See application file for complete search history.

(56) References Cited

U.S. PATENT DOCUMENTS 5,700,127 A * 12/1997 Harada et al. .......... 414/416.08

6,377,329 B1 * 4/2002 Takekuma .................... 355/27
2006/0201423 A1 9/2006 Akimoto et al.

FOREIGN PATENT DOCUMENTS

JP 2006-253501 9/2006

* cited by examiner

*Primary Examiner*—Alan A Mathews
(74) *Attorney, Agent, or Firm*—Oblon, Spivak, McClelland, Maier & Neustadt, L.L.P.

(57) ABSTRACT

Disclosed herein is a coating and developing apparatus 1 whose decreases in substrate-conveying accuracy can be suppressed. A processing block S2 of the coating and developing apparatus 1 includes multiple resist-film forming blocks G2, G3, and a developing block G1. A conveyance element 12 for substrate loading into the processing block S2 is provided to convey substrates W from a carrier C to the resist-film forming blocks G2, G3. Also, a conveyance element I for substrate loading into an exposure apparatus S4 is provided in an interface block S3 to load the substrates W into the exposure apparatus S4 and after unloading the substrates W from the exposure apparatus S4, convey the substrates W to the developing block G1. The processing block loading conveyance element 12 conveys the substrates W, one at a time, from the carrier C to each resist-film forming block G2, G3, sequentially and periodically, and the exposure apparatus loading conveyance element I loads the substrates W from each resist-film forming block G2, G3 into the exposure apparatus S4 in the sequence that each has been conveyed to the resist-film forming block G2, G3 by the processing block loading conveyance element 12.

21 Claims, 14 Drawing Sheets

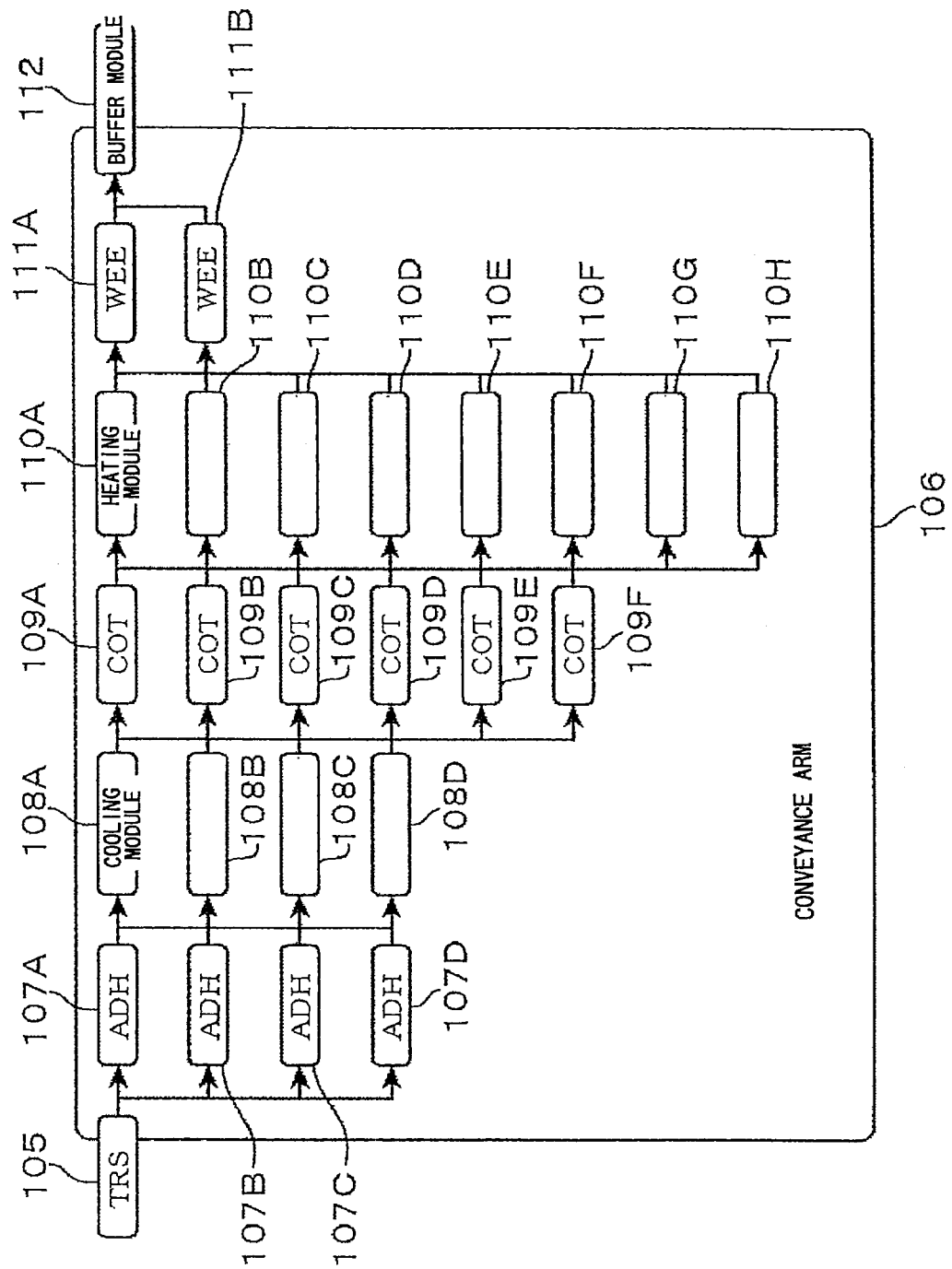
F I G. 14

COATING AND DEVELOPING APPARATUS, COATING AND DEVELOPING METHOD, AND STORAGE MEDIUM

CROSS-REFERENCE TO RELATED APPLICATIONS

The present patent application benefits from the Japanese Patent Application, Ser. No. JP-2007-221609, filed on Aug. 28, 2007, the disclosure of which is hereby incorporated by reference in its entirety.

BACKGROUND OF THE INVENTION

1. Field of the Invention

The present invention relates to a method and apparatus for coating a substrate surface such as a semiconductor wafer or liquid-crystal display (LCD) glass substrate surface, with a resist liquid and developing the substrate after exposure thereof to light. The invention also concerns a storage medium used for these coating and developing operations.

2. Description of the Related Art

In a photoresist process that is one of semiconductor-manufacturing processes, the surface of a semiconductor wafer (hereinafter, also referred to simply as a wafer) is coated with a resist, and then after exposure of this resist on the wafer to light with a required pattern, the wafer is developed to form a resist pattern on the surface thereof. Such processing generally uses a system that has an exposure apparatus connected to a coating and developing apparatus for resist-coating and developing wafers.

As described in JP-A-2006-253501, for example, a known coating and developing apparatus includes a carrier block into which a carrier containing a plurality of semiconductor wafers is loaded, an interface block for transferring each wafer to and from an exposure apparatus, and a processing block provided between the carrier block and the interface block.

The processing block includes a coating block in which a coating (COT) module for coating the wafer with a resist is included, and a developing block in which a developing (DEV) module for supplying a developing agent to and developing the resist-coated wafer is included. The coating block and the developing block are arranged in layers. The coating block and the developing block include a heating module and a cooling module, respectively, to heat and cool the wafer before and after its resist-coating and developing steps. Both the coating block and the developing block also include an arm for conveying the wafer from one module to another module.

For improved throughput, the coating module, the developing module, the heating module, the cooling module, and other process modules for processing wafers are each provided in a plurality of places in the coating block and the developing block. Wafers that have been sequentially unloaded from the carrier are each conveyed to an empty process module having no wafers loaded thereinto, and undergo concurrent processing in each process module. After this, each processed wafer is sequentially unloaded from each process module into empty process modules provided at the next stage.

FIG. 13 shows the modules in the coating and developing apparatus, and a conveying route of wafers between the modules. A wafer that has been unloaded from the carrier 101 is conveyed to a transfer (TRS) stage 103 by a carrier arm 102 provided in the carrier block described above. After that, the wafer is conveyed first to a transfer arm 104 that moves vertically in the processing block, and then to a TRS stage 105.

After this, the wafer is further conveyed to a coating block, in which the wafer is then transferred to an adhesion (ADH) process (hydrophobizing) module 107A or 107B, a cooling module 108A or 108B, a COT module 109A, 109B, or 109C, either of heating modules 110A to 110D, a wafer edge exposure (WEE) module 111, and a buffer module 112, in that order, by a dedicated conveyance arm 106 for the coating block.

After that, the wafer is conveyed to an exposure apparatus 113 via the transfer arm 104, a shuttle arm 112 that moves from the carrier block to the interface block, and an interface arm 114 within the interface block, in that order, and is exposed to light.

The exposed wafer is conveyed to a TRS stage 115A or 115B via the interface arm 114. After this, the wafer is further conveyed to either heating module from 117A to 117F, a cooling module 118A or 118B, either DEV module from 119A to 119F, either heating module from 120A to 120F, and a TRS stage 121A or 121B, in that order, by a conveyance arm 116 provided in the developing block. The wafer is returned to the carrier 101 after that.

Further improving the throughput of such a coating and developing apparatus is under consideration to achieve a target throughput of, for example, about 200 to 300 wafers per hour (3,600 seconds). To achieve the throughput of 200 wafers per hour, the above coating and developing steps need to be performed at a rate of 3,600 seconds/200 wafers=18 seconds/wafer. To achieve the throughput of 300 wafers per hour, the coating and developing steps need to be performed at a rate of 3,600 seconds/300 wafers=12 seconds/wafer.

If the conveyance of one wafer from a module of the immediately previous stage to a module of the immediately following stage is counted as one conveying operation, the conveyance arm 106 repeats the conveying operation a total of six times in the coating block to move the wafer from the TRS stage 105 to the buffer module 112. In order to achieve the above throughput values, therefore, the intermodule conveyance time per operation is set to be a maximum of 18 seconds/6=3 seconds for the throughput of 200 wafers/hour, or a maximum of 12 seconds/6=2 seconds for the throughput of 300 wafers/hour.

To convey the wafer at such a speed, it becomes necessary to specify the wafer conveyance destination so that upon completion of processing in one module, the wafer can be immediately conveyed to the next module. Therefore, installing each module in a larger number of places in the coating and developing blocks and increasing the number of wafers to undergo concurrent processing in modules of the same kind is considered. FIG. 14 shows an example in which the number of modules of the same kind in the coating block is increased.

However, there is the problem that for example, if the conveying speed of the conveyance arm 106 is raised to allow intermodule conveyance within 2 or 3 seconds for improved throughput, an increase in load of the conveyance arm 106 could be more likely to cause a conveying error such as a fall of the wafer from the conveyance arm 106 during conveyance. A method of solving this problem is not described in above-mentioned JP-A-2006-253501.

SUMMARY OF THE INVENTION

The present invention was made for solving the above problem, and an object of the invention is to provide a coating and developing apparatus and a coating and developing method, in both of which a conveying speed of a conveying mechanism for conveying substrates between modules which process the substrates can be controlled to suppress decreases in conveyance accuracy of the substrates. The invention is also intended to provide a storage medium used for the above coating and developing apparatus and method.

A coating and developing apparatus according to an aspect of the present invention comprises a carrier block into which substrates are loaded from a carrier, a processing block to and from which the loaded substrates within the carrier block are transferred, the processing block being adapted to form a coating, inclusive of a resist film, on the substrates, and an interface block from which the substrates each having the coating formed thereon by the processing block are conveyed to an exposure apparatus for exposure to light, wherein: the processing block includes a plurality of resist-film forming blocks each extending from a direction of the carrier block, towards the interface block, and a developing block extending from the direction of the carrier block, towards the interface block; conveyance means for substrate loading into the processing block is provided in the carrier block, the conveyance means for substrate loading adapted to convey the substrates from the carrier to the resist-film forming blocks; conveyance means for substrate loading into the exposure apparatus is provided in the interface block, the conveyance means for substrate loading adapted to convey the substrates to the exposure apparatus and after unloading the substrates therefrom, convey the substrates to the developing block; and the conveyance means for substrate loading into the processing block conveys the substrates, one at a time, from the carrier to each resist-film forming block sequentially and periodically, and the conveyance means for substrate loading into the exposure apparatus loads the substrates from each resist-film forming block into the exposure apparatus in the sequence that each substrate has been conveyed to each resist-film forming block by the processing block loading conveyance means.

Each resist-film forming block and the developing block may be stacked in layer form upon each other. For example, the apparatus may also have the above resist-film forming block in two places and be constructed so that the processing block loading conveyance means conveys the substrates from the carrier, one at a time, in alternate form to each resist-film forming block, and so that the exposure apparatus loading conveyance means loads the substrates within each resist-film forming block into the exposure apparatus alternately in order of conveyance from the carrier to each resist-film forming block. For example, the developing block may be provided in a plurality of places, and after exposure of the substrates, the exposure apparatus loading conveyance means may periodically convey the exposed substrates, one by one, from the exposure apparatus to each developing block. Furthermore, each resist-film forming block may have a plurality of coating modules each for coating each substrate with a resist, heating modules each for heating the substrate, and cooling modules each for cooling the substrate.

A coating and developing method according to another aspect of the present invention uses a coating and developing apparatus to coat substrates with a resist and to develop the substrates after exposure thereof to light, wherein: the coating and developing apparatus includes a carrier block into which substrates are carried by a carrier, a processing block to and from which the substrates that have been carried into the carrier block are transferred, the processing block forming a film coating, inclusive of a resist film, upon the substrates, and an interface block for conveying to an optical exposure apparatus the substrates each having the film coating formed thereon by the processing block; the processing block includes a plurality of resist-film forming blocks each extending from a direction of the carrier block, towards the interface block, and a developing block extending from the direction of the carrier block, towards the interface block; conveyance means for substrate loading into the processing block is provided in the carrier block, the conveyance means for substrate loading adapted to convey the substrates from the carrier to the resist-film forming blocks; conveyance means for substrate loading into the exposure apparatus is provided in the interface block, the conveyance means for substrate loading adapted to convey the substrates to the exposure apparatus and after unloading the substrates therefrom, convey the substrates to the developing block; and the coating and developing method comprises the step of using the processing block loading conveyance means to convey the substrates, one at a time, from the carrier to each resist-film forming block sequentially and periodically, and the step of using the exposure apparatus loading conveyance means to load the substrates from the resist-film forming blocks into the exposure apparatus in the sequence that each substrate has been conveyed to each resist-film forming block by the processing block loading conveyance means.

The apparatus may include the above resist-film forming block in two places, and be constructed so that the processing block loading conveyance means conveys the substrates from the carrier, one at a time, in alternate form to each resist-film forming block, and so that the exposure apparatus loading conveyance means loads the substrates within each resist-film forming block into the exposure apparatus alternately in order of loading from the carrier into each resist-film forming block.

In addition, the apparatus may include the above developing block in a plurality of places, and the coating and developing method may further comprise the step of using the exposure apparatus loading conveyance means to, after exposure of the substrates, periodically convey the exposed substrates, one by one, from the exposure apparatus to each developing block.

A storage medium according to yet another aspect of the present invention contains a computer program operating on a computer and is used for a coating and developing method which activates a coating and developing apparatus to coat substrates with a resist and to develop the substrates after exposure thereof to light, wherein: the coating and developing apparatus includes a carrier block into which substrates are carried by a carrier; a processing block to and from which the substrates that have been carried into the carrier block are transferred, the processing block forming a film coating, inclusive of a resist film, upon the substrates, and an interface block for conveying to an optical exposure apparatus the substrates each having the film coating formed thereon by the processing block; the processing block includes a plurality of resist-film forming blocks each extending from a direction of the carrier block, towards the interface block, and a developing block extending from the direction of the carrier block, towards the interface block; conveyance means for substrate loading into the processing block is provided in the carrier block, the conveyance means for substrate loading adapted to convey the substrates from the carrier to the resist-film forming blocks; conveyance means for substrate loading into the exposure apparatus is provided in the interface block, the conveyance means for substrate loading adapted to convey the substrates to the exposure apparatus and after unloading the substrates therefrom, convey the substrates to the developing block; and the coating and developing method comprises the step of using the processing block loading conveyance means to convey the substrates, one at a time, from the carrier to each resist-film forming block sequentially and periodically, and the step of using the exposure apparatus loading conveyance means to load the substrates from the resist-film forming blocks into the exposure apparatus in the sequence that each substrate has been conveyed to each resist-film forming block by the processing block loading conveyance means.

According to the present invention, the processing block loading conveyance means conveys the substrates, one at a time, from the carrier to each resist-film forming block sequentially and periodically, and the exposure apparatus loading conveyance means loads the substrates from each resist-film forming block into the exposure apparatus in the sequence that each substrate has been conveyed to each resist-film forming block by the processing block loading conveyance means. In the above configuration, therefore, compared with a configuration in which a plurality or large number of modules of the same kind are installed in one resist-film forming block in order to achieve equivalent throughput, forming a resist film concurrently in each of the plurality of resist-film forming blocks and sequentially loading the substrates each having the resist film formed thereon into the exposure apparatus reduces the resist-film forming conveyance elements in load, thus suppressing decreases in wafer-conveying accuracy in the modules included in each resist-film forming block.

BRIEF DESCRIPTION OF THE DRAWINGS

FIG. 5 is a conveyance schedule table relating to wafers conveyed in the coating and developing apparatus of the first embodiment;

FIG. 6 is another conveyance schedule table relating to the wafers conveyed in the coating and developing apparatus of the first embodiment;

FIG. 14 is a wafer conveyance diagram showing an example in which the number of modules in a coating block of the conventional coating and developing apparatus is increased.

DESCRIPTION OF THE PREFERRED EMBODIMENTS

First Embodiment

Figure 1:
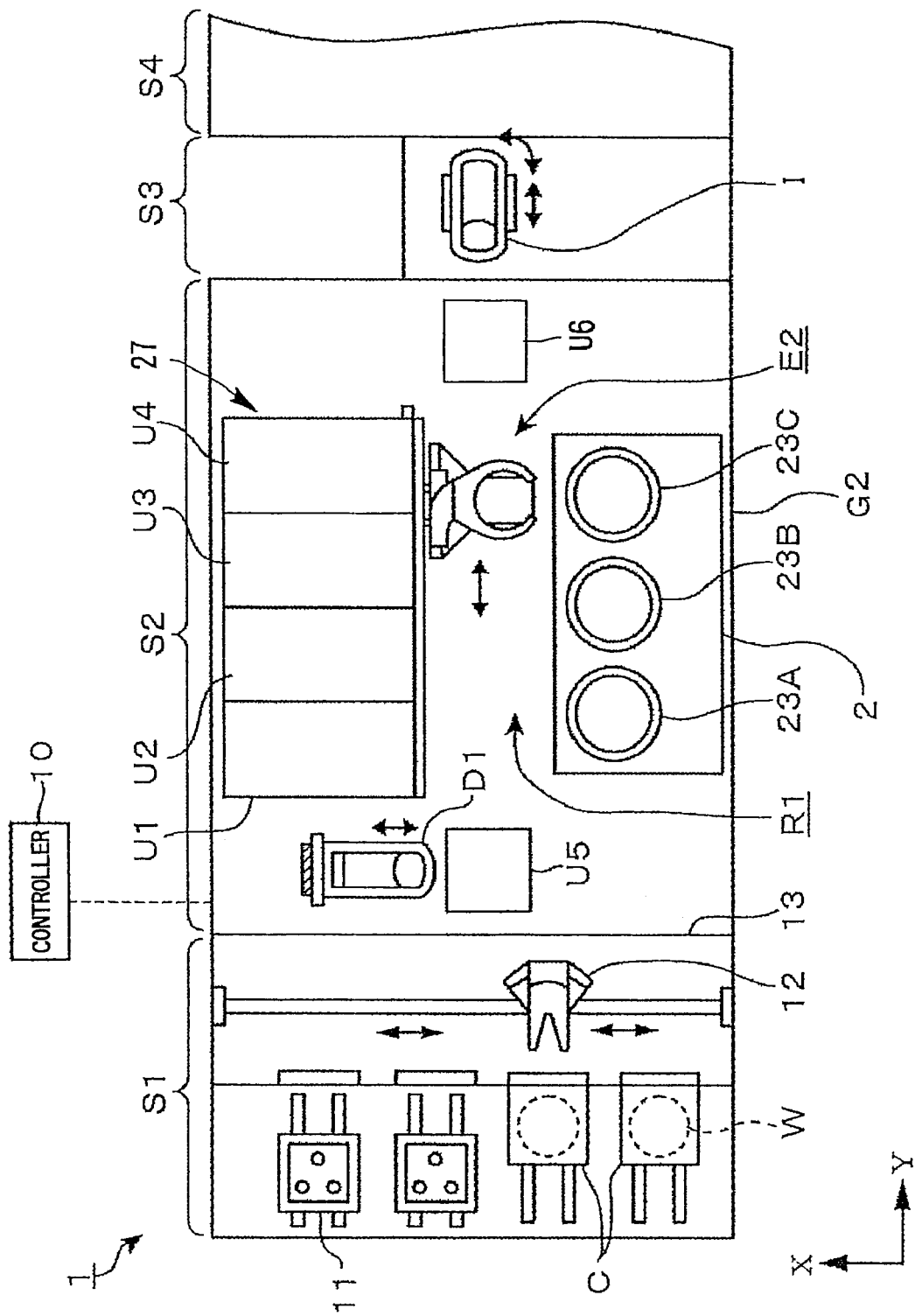
FIG. 1 is a cross-sectional plan view showing a coating and developing apparatus according to a first embodiment of the present invention.
Figure 2:
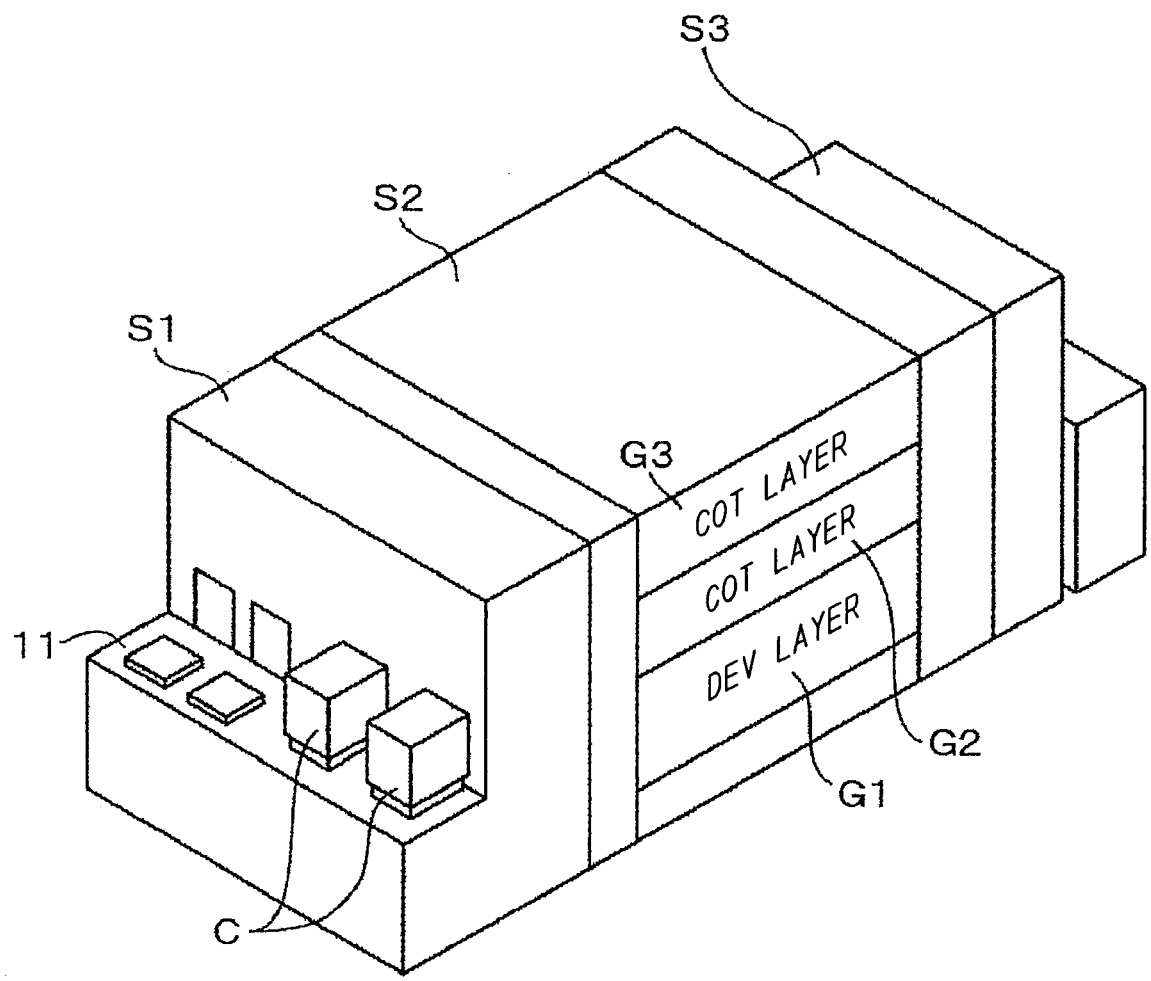
FIG. 2 is a perspective view showing the coating and developing apparatus of the first embodiment.
Figure 3:
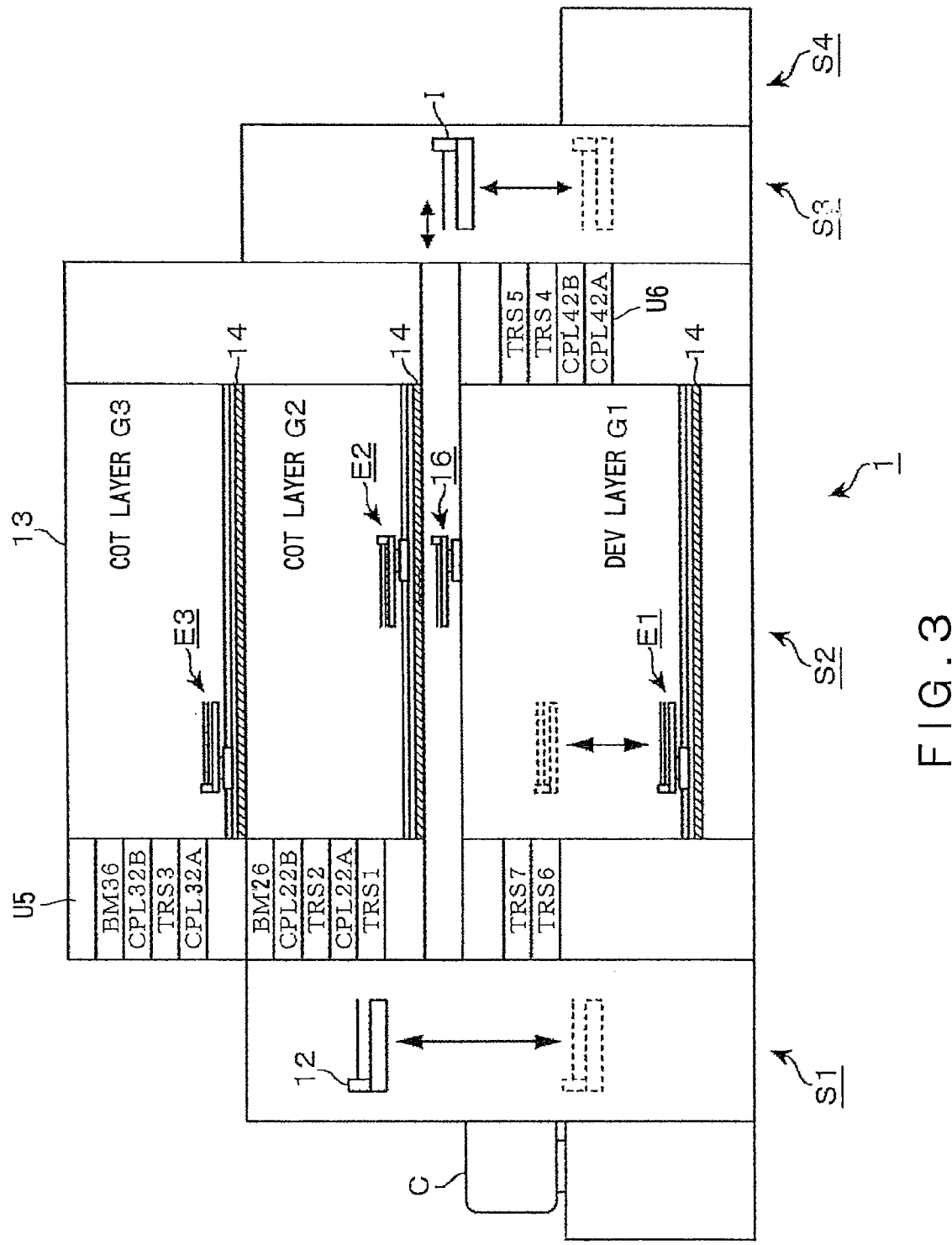
FIG. 3 is a longitudinal plan view showing the coating and developing apparatus of the first embodiment.

A coating and developing apparatus 1 that is a first embodiment is described below using FIGS. 1 to 3. FIG. 1 is a plan view of a system having an exposure apparatus S4 connected to the coating and developing apparatus 1. FIG. 2 is a perspective view of the system. FIG. 3 is a longitudinal plan view thereof.

The coating and developing apparatus 1 includes a carrier block S1, which includes carrier-mounting tables 11 and a transfer arm 12. The transfer arm 12 in the carrier block S1 is constructed to remove wafers W from hermetically sealed carriers C mounted on each table 11, and then transfer each wafer W to a processing block S2 adjacent to the carrier block S1. The transfer arm 12 that functions at this time as a conveyance element for loading the wafer W into the processing block S2 is hereinafter referred to as the processing block loading conveyance element. In addition, the transfer arm 12 is constructed to receive a processed wafer W from the processing block S2 and return this processed wafer W to the carrier C. The transfer arm 12 at this time is hereinafter referred to as an unloading conveyance element. The carrier C contains 25 wafers W, for example. A lot number of the wafers W differ for each carrier C.

The processing block S2 has an enclosure 13 that surrounds the block in its entirety. As shown in FIGS. 2 and 3, the processing block S2 also has three blocks sequentially stacked in layer form upon one another from below. The three blocks are a first block (developing block: DEV layer) G1 for developing, a second block (resist-film forming block: COT layer) G2 provided to form a coating inclusive of a resist film, and a third block (resist-film forming block: COT layer) G3 provided to form a coating inclusive of a resist film. The three layers are separated by partition plates 14, as shown in FIG. 3.

As shown in FIG. 1, the second block (COT layer) G2 includes: a coating unit 2 that includes three coating (COT) modules, 23A to 23C, to form the resist film by spin coating; a heating/cooling process module group 27 for pre-processing and post-processing with respect to processing conducted by the coating unit 2; and a conveyance arm E2 provided between the coating unit 2 and the process module group 27 in order to transfer wafers therebetween.

Locations to which each wafer is transferred are called modules. Conveyance arms E2 and E3 are conveyance elements for forming the resist film.

Figure 4:
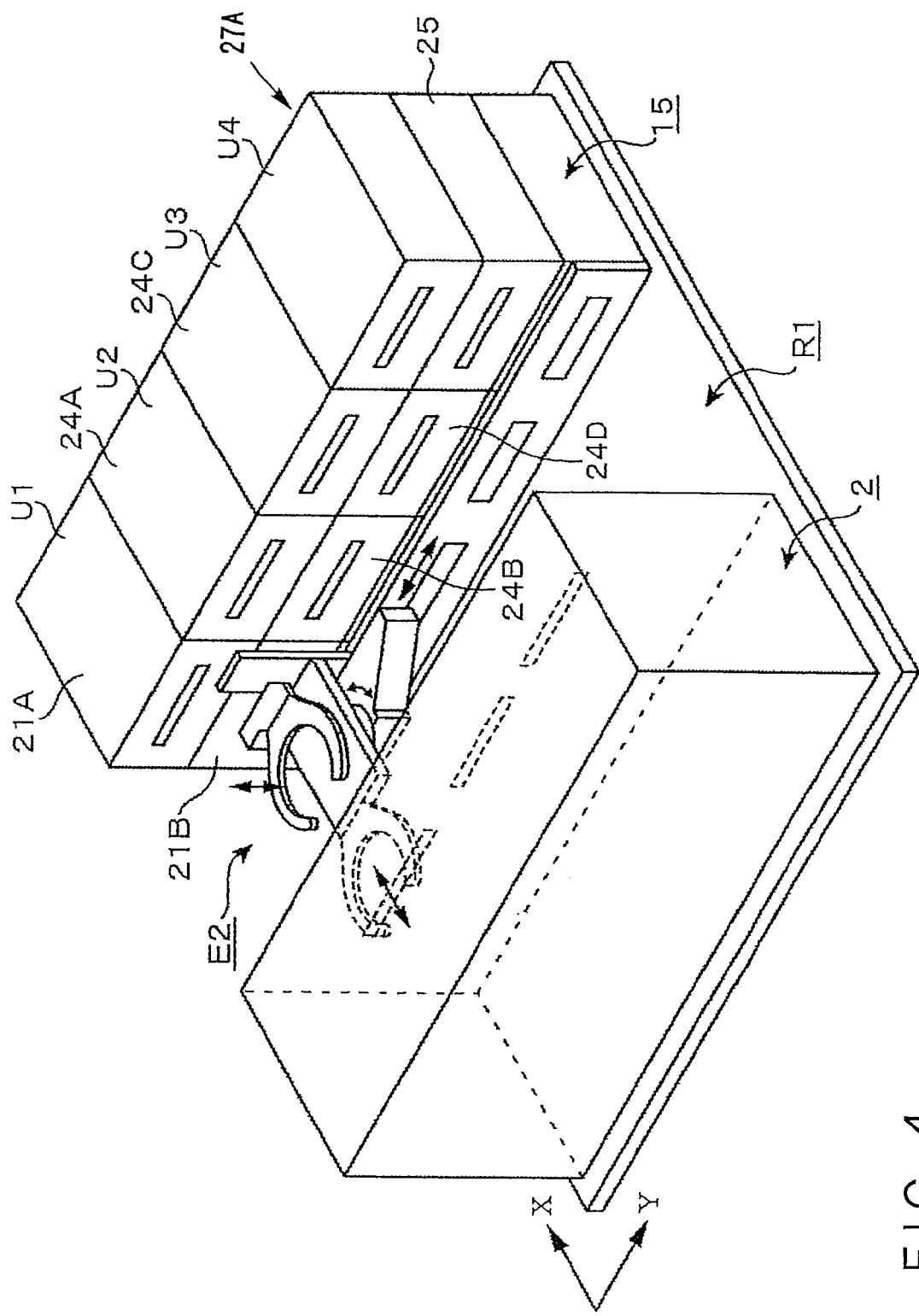
FIG. 4 is a perspective view that shows COT layers included in the coating and developing apparatus of the first embodiment.

FIG. 4 is a perspective view that shows each module of the second block (COT layer) G2. A heating/cooling process unit group 27A is shown in FIG. 4. The heating/cooling process unit group 27A includes, for example, adhesion (ADH) process (hydrophobizing) modules 21A and 21B for hydrophobizing the wafer existing before being resist-coated, heating (HP) modules 24A to 24D for heating the wafer existing after being resist-coated, and a wafer edge exposure (WEE) module 25 for exposing a circumferential edge of the wafer to light.

These modules are formed in multi-layer form, constituting shelf units U1 to U4. The shelf units U1 to U4 are arrayed along a conveyance route R1 formed from a direction of the carrier block S1, towards an interface block S3, and the conveyance arm E2 moves along the conveyance route R1. In FIG. 4, the ADH modules 21A and 21B are included in the shelf unit U1, the HP modules 24A to 24D in the shelf units U2 and U3, and the WEE module 25 in the shelf unit U4. Also, an exhaust unit 15 for releasing air from the conveyance route R1 is provided at lower sections of the shelf units U1 to U4.

The third block (COT layer) G3 is constructed similarly to the COT layer G2, and has adhesion (ADH) process (hydrophobizing) modules 31A and 31B, coating (COT) modules 33A to 33C, heating modules 34A to 34D, and a wafer edge exposure (WEE) module 35, at positions equivalent to the ADH modules 21A and 21B, COT modules 23A to 23C, heating modules 24A to 24D, and WEE module 25 in the COT layer G2.

The first block (DEV layer) G1 is of a construction similar to that of the second or third block. In the DEV layer G1, developing units for developing the wafer are stacked in two-layer form at positions equivalent to those of the coating unit 2.

These developing units each include three developing (DEV) modules for supplying a developing solution to, and developing, the wafer. That is to say, the DEV layer G1 includes six developing (DEV) modules in all, which are termed 43A, 43B, 43C, 43D, 43E, and 43F. A conveyance arm E1 that is a developing conveyance element for conveying the wafer W to the DEV modules 43A to 43F is provided inside the DEV layer G1. In other words, the conveyance arm E1 is used in common for the two developing unit stages.

After exposure of the substrates, the DEV layer G1 further has heating (HP) modules 41A to 41F for heating the wafer existing before being coated with the developing solution, and heating modules 44A to 44F for heating the wafer existing after being developed. These heating modules, as with the shelf units U1 to U4 of the COT layer G2, are stacked in layers to constitute a plurality of shelf units. These shelf units of the DEV layer G1 are arrayed in substantially the same layout form as that of the shelf units U1 to U4. The wafer W is transferred between these modules by the conveyance arm E1.

An internal upper section of the DEV layer G1 has a shuttle arm 16 that is a dedicated conveyance element for direct conveyance of the wafer W from the carrier block S1 to the interface block S3. The wafer W with the resist film formed thereon is transferred to the shuttle arm 16 via a transfer arm D1, then carried into the interface block S3 by the shuttle arm 16, and further transferred to an interface arm I. In the present embodiment, the interface arm I constitutes an exposure apparatus loading conveyance element.

The processing block S2 further has a shelf unit U5 as shown in FIGS. 1 and 3. As shown in FIG. 3, TRS6 and TRS7 that are transfer stages for developed-wafer transfer are provided in stacked form, in that order from below, in positions of the shelf unit U5 that are equivalent to those of the DEV layer G1. Similarly, a transfer stage TRS1, a cooling module CPL22A, a transfer stage TRS2, a cooling module CPL22B, and a buffer module BM26 are provided in stacked form, in that order from below, in positions of the shelf unit U5 that are equivalent to those of the COT layer G2. Additionally, a cooling module CPL32A, a transfer stage TRS3, a cooling module CPL32B, and a buffer module BM36 are provided in stacked form, in that order from below, in positions of the shelf unit U5 that are equivalent to those of the COT layer G3. The conveyance arms E1 to E3 in the layers G1 to G3, respectively, can access the associated modules included in the shelf unit U5. In this configuration, TRS2 and TRS3 constitute the transfer stages for loading into the COT layers G2 and G3, respectively.

The cooling modules CPL cool the wafers W that have been heated by the heating modules HP of the layers G1 to G3. The plurality of wafers W that have been coated in the COT layer G2 or G3 are made to temporarily reside in the buffer modules BM until the coated wafers are loaded into the exposure apparatus S4. Also, the heating modules HP 24A to 24D, 34A to 34D, 41A to 41F, and 44A to 44F each has a temperature-controllable heat plate to heat the wafer W mounted thereon.

The arm D1 that is a liftable first transfer arm provided near the shelf unit U5 is constructed to access the modules of the shelf unit U5 and convey the wafer W between the modules.

As shown in FIGS. 1 and 3, a shelf unit U6 is provided near the interface block S3, in the processing block S2. As shown in FIG. 3, cooling modules CPL42A, CPL24B and transfer stages TRS4, TRS5 are provided in stacked form, in that order from below, in positions of the shelf unit U6 that are equivalent to those of the DEV layer G1. The conveyance arm E1 in the DEV layer G1 and the interface arm I can access the above modules of the shelf unit U6. TRS4 and TRS5 are exposed-wafer transfer stages.

Meanwhile, the exposure apparatus S4 is connected to the processing block S2 via the interface block S3. The interface block S3 has the interface arm I for transferring the wafer W to each module in the shelf unit U6 of the processing block S2 and to the exposure apparatus S4. The interface arm I is adapted to receive the wafer W that has been carried into the interface block S3 via the shuttle arm 16, and then load this wafer W into the exposure apparatus S4.

A controller 10 is described below. The controller 10 includes, for example, a computer and has a program storage section not shown. This program storage section contains a program, such as software, that has a built-in set of instructions to ensure that the developing process set forth in later description of operation is conducted. Readout of this program into the controller 10 allows the controller 10 to control conveyance arm operation, processing temperatures of the wafer in each module, and supply of the developing solution and the resist liquid to the wafer, and as described later, conduct the coating and developing processes upon the wafer W. The above program is stored in the form of a storage medium such as a hard disk, compact disc, magneto-optical disc, or memory card, in the program storage section.

For example, if such a plurality of modules of a kind as the COT modules 23A to 23C of the COT layer G2 are present, the controller 10 conveys the wafer W to any one of the modules that is ready to accept the wafer. For example, each module is constructed so that the module, after becoming ready to accept the wafer from a module of an immediately preceding stage, outputs an IN READY signal to the controller 10 to indicate that the wafer can be accepted. After processing the wafer and becoming ready to unload the wafer, the module outputs an OUT READY signal to the controller 10. The controller 10 can use these signals to judge from which module to which module the wafer can be conveyed at a particular point of time.

In addition, for example, if 25 wafers W are accommodated in the carrier C during a time period to the loading of a wafer W into the coating and developing apparatus 1, the controller 10 assigns substrate numbers 1 to 25 to the 25 wafers in order of their loading into the carrier block S1. Furthermore, the controller 10 determines a conveying schedule specifying that the first wafer numbered "1" and the last wafer numbered "25" be respectively conveyed to which modules.

Figure 5:
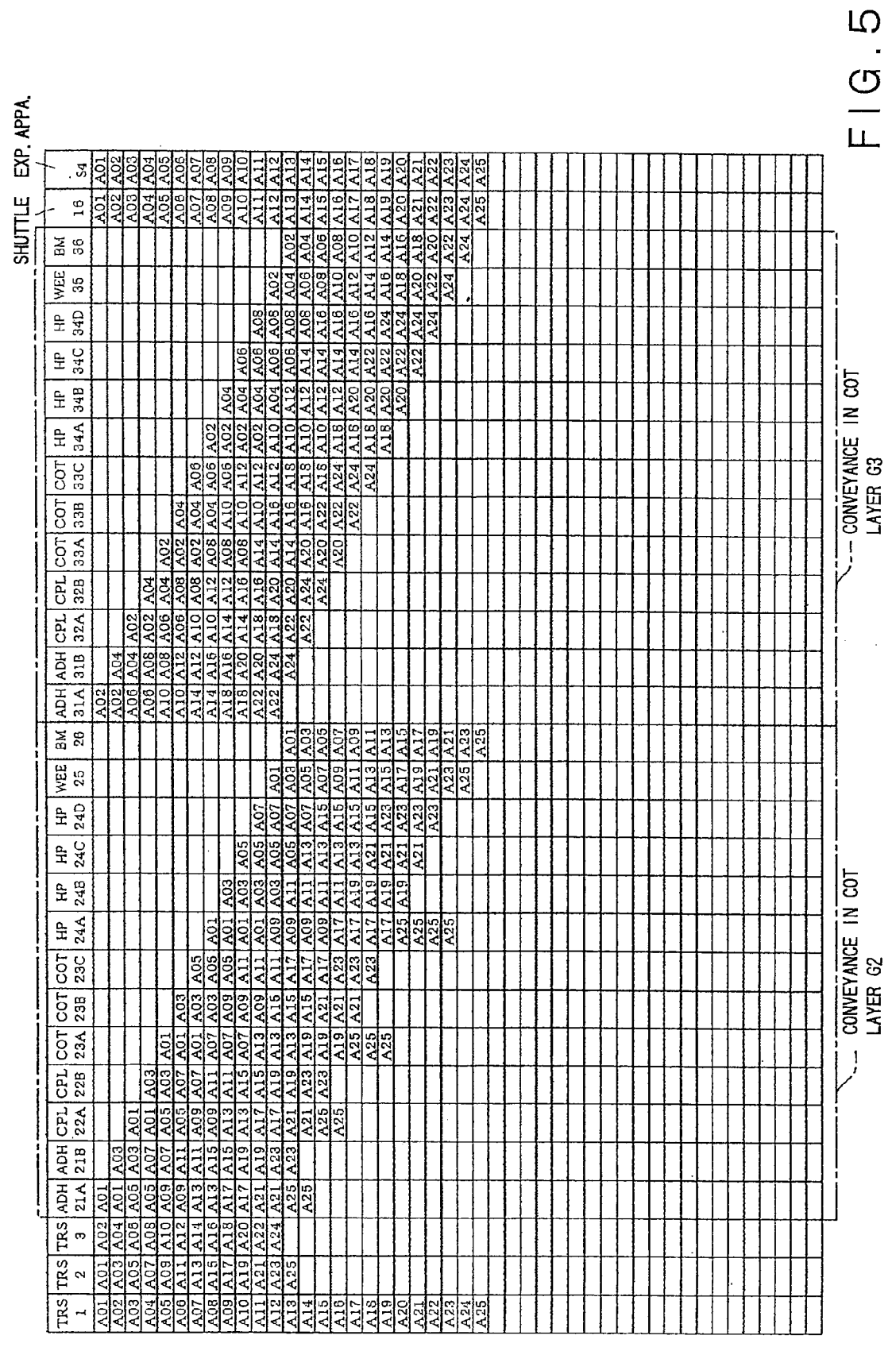
Figure 6:
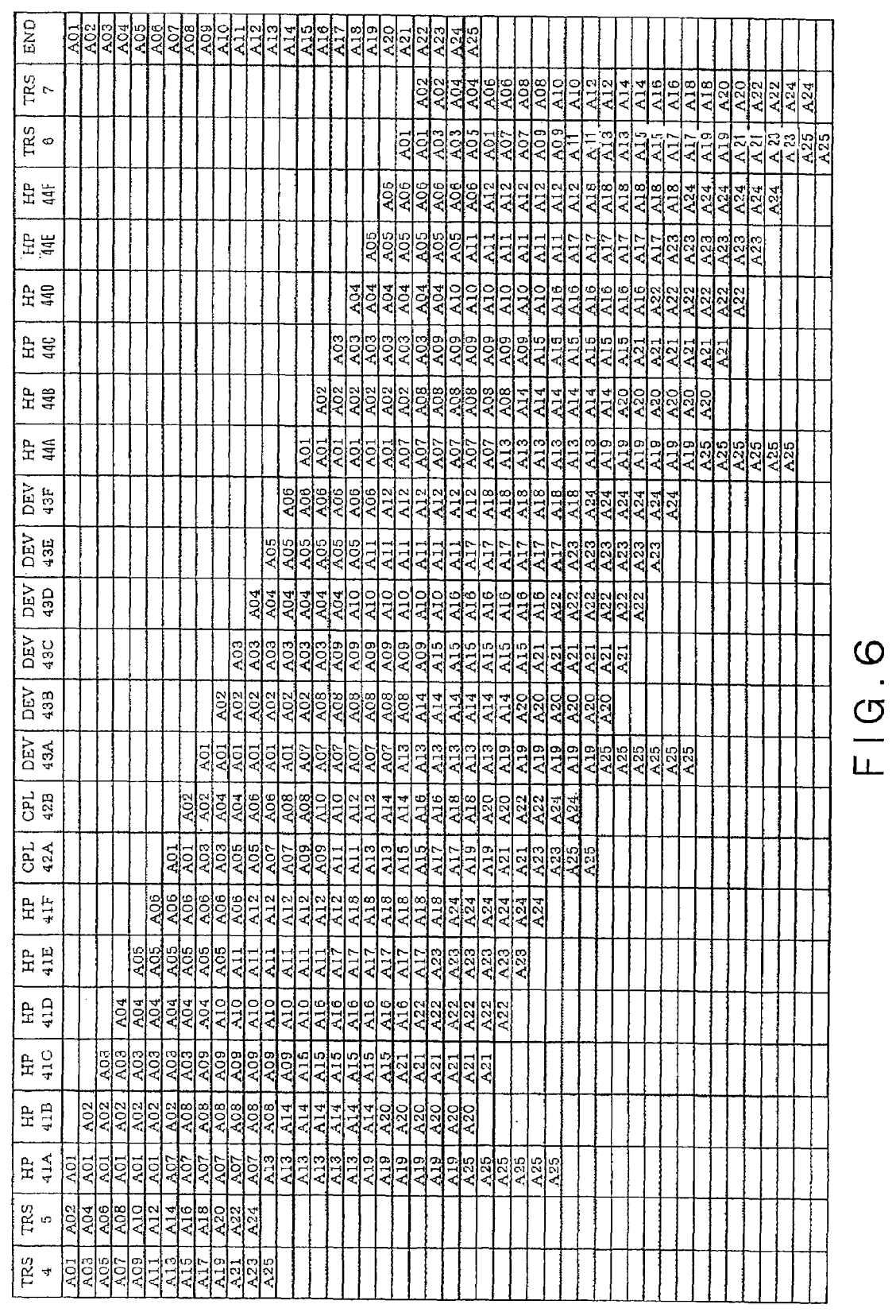

FIGS. 5 and 6 are tabular representations of conveyance schedules relating to a plurality of wafers accommodated in a desired carrier C. FIG. 5 shows the schedule in which the multiple wafers W that have been unloaded from the carrier C are specified to be conveyed to the exposure apparatus S4. FIG. 6 shows the schedule in which the multiple wafers W that have been unloaded from the exposure apparatus S4 are specified to be returned to the carrier C.

The conveyance arms E1 to E3 of the layers G1 to G3 are adapted to convey the wafers W within the layers asynchronously, that is, independently of one another. That is to say, in the conveyance schedule table as shown in FIG. 5, conveyance between the modules of the COT layer G2 that are enclosed in a single-dotted line, and conveyance between the modules of the COT layer G3 that are also enclosed in a single-dotted line occur concurrently and independently of each other.

Figure 7:
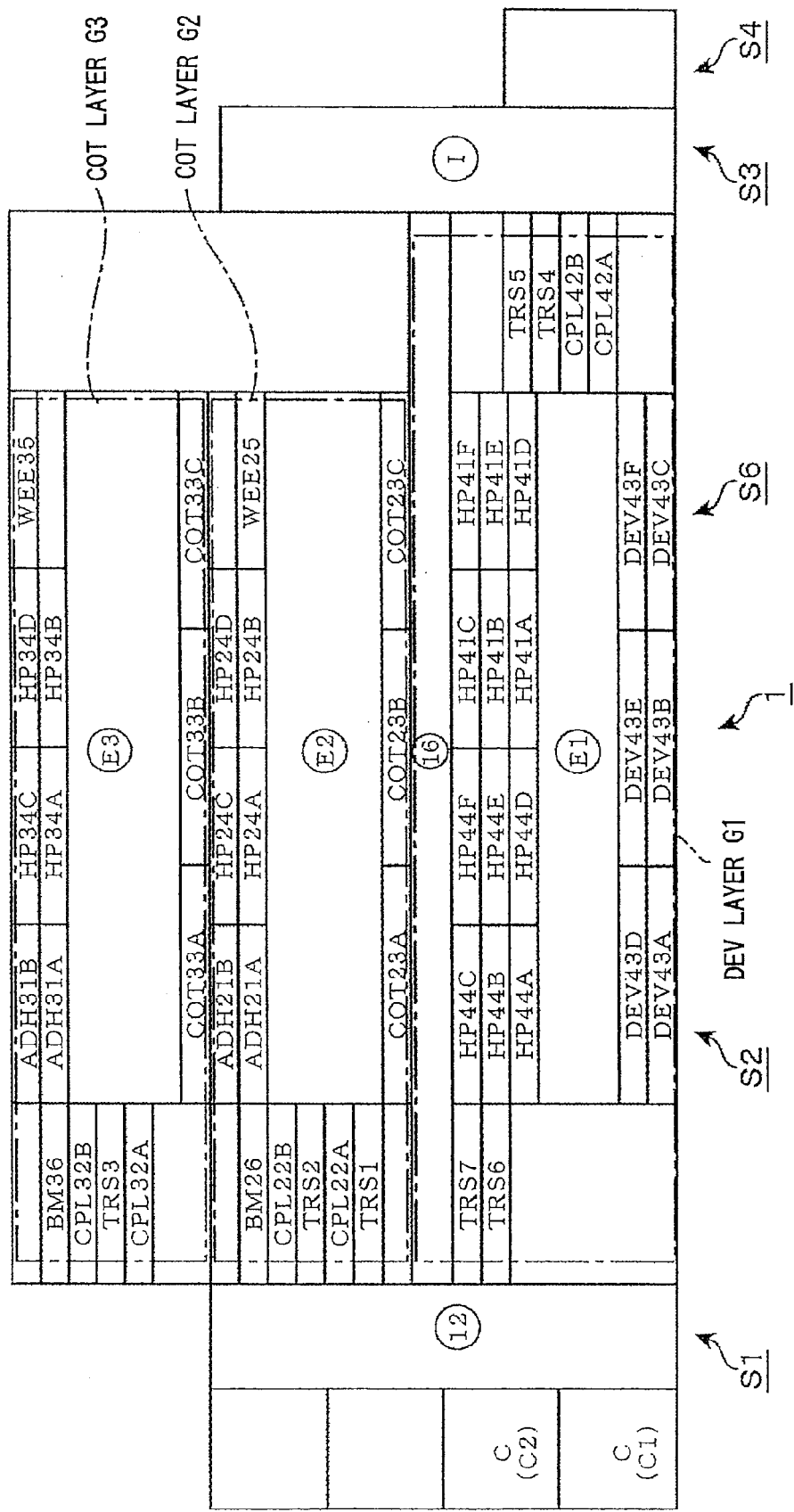
FIG. 7 is a schematic diagram that shows various modules included in the coating and developing apparatus of the first embodiment.
Figure 8:
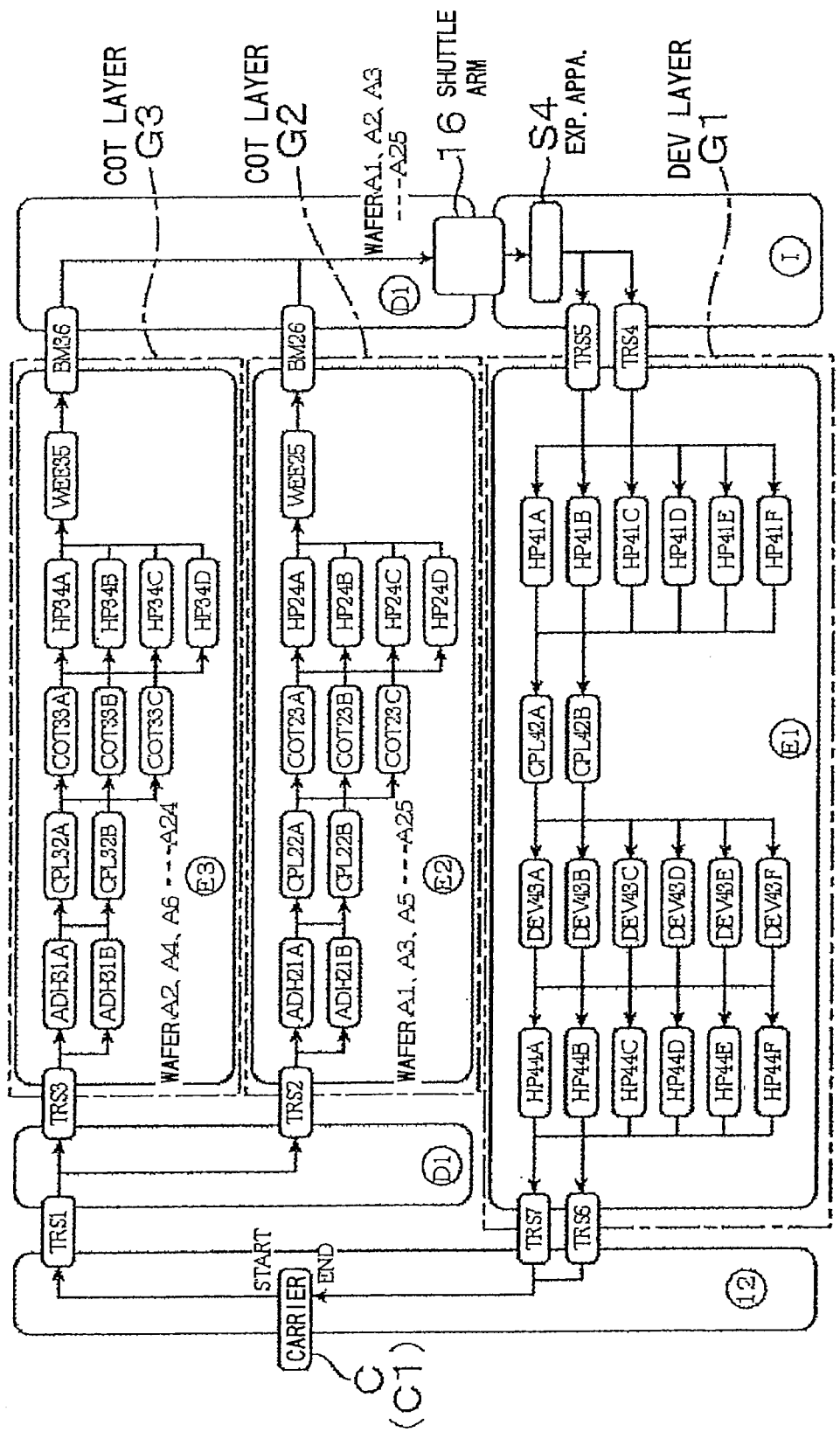
FIG. 8 is a flow diagram showing the conveyance of the wafers between the modules.

Wafer conveyance from the desired carrier in the coating and developing apparatus 1 is next described referring to FIGS. 5 to 8. For convenience' sake, the description assumes that the carrier is defined as C1, that the wafers W within the carrier C1 are defined as wafers A, and that the wafers A are conveyed between modules in accordance with the conveyance schedules shown in FIGS. 5 and 6. FIG. 7 is a layout diagram in which the modules, conveyance arms, and others provided in each block of the coating and developing apparatus 1 are shown in planarly developed view for convenience' sake. FIG. 8 shows a conveying route of the wafers.

(Step 1)

Upon conveyance of the carrier C1 to the carrier block S1, a wafer A1 is first conveyed from the carrier C1 to a carrier arm 12, the transfer stage TRS1, the transfer arm D1, and the transfer stage TRS2, in that order. After this, the wafer A1 is conveyed from the transfer stage TRS2 to a hydrophobizing module ADH21A by the conveyance arm E2 of the COT layer G2 in order to undergo hydrophobizing. Next, a wafer A2 is conveyed from the carrier C1 to the carrier arm 12, the transfer stage TRS1, the transfer arm D1, and the transfer stage TRS3, in that order. After this, the wafer A2 is conveyed from TRS3 to a hydrophobizing module ADH31A by the conveyance arm E3 of the COT layer G3 in order to undergo hydrophobizing.

(Step 2)

After the above, a wafer A3 is conveyed from the carrier C1 to the transfer stage TRS2 via substantially the same route as that of the wafer A1, and is further conveyed from TRS2 to a hydrophobizing module ADH21B via the conveyance arm E2. Next, a wafer A4 is conveyed from the carrier C1 to the transfer stage TRS3 via substantially the same route as that of the wafer A2, and is further conveyed from TRS3 to a hydrophobizing module ADH31B via the conveyance arm E3.

(Step 3)

After being hydrophobized by the hydrophobizing module ADH21A, the wafer A1 is conveyed to ADH21A, the conveyance arm E2, and the cooling module CPL22A, in that order. Meanwhile, the wafer A2, after being hydrophobized by the hydrophobizing module ADH31A, is conveyed to ADH31A, the conveyance arm E3, and the cooling module CPL32A, in that order. Furthermore in the meantime, a wafer A5 is conveyed from the carrier C1 to the transfer stage TRS2 via substantially the same route as that of the wafer A1, and is further conveyed from TRS2 to the hydrophobizing module ADH21A via the conveyance arm E2. Next, a wafer A6 is conveyed from the carrier C1 to the transfer stage TRS3 via substantially the same route as that of the wafer A2, and is further conveyed from TRS3 to the hydrophobizing module ADH31A via the conveyance arm E3.

(Step 4)

After being hydrophobized by the hydrophobizing module ADH21B, the wafer A3 is conveyed to ADH21B, the conveyance arm E2, and the cooling module CPL22B, in that order. Meanwhile, the wafer A4, after being hydrophobized by the hydrophobizing module ADH31B, is conveyed to ADH31B, the conveyance arm E3, and the cooling module CPL32B, in that order.

(Step 5)

The wafer A1 that has been cooled in the cooling module CPL22A is conveyed to the coating module COT23A via the conveyance arm E2 in order to undergo the resist-coating process. Meanwhile, the wafer A2 that has been cooled in the cooling module CPL32A is conveyed to the coating module COT33A via the conveyance arm E3 in order to undergo the resist-coating process.

(Step 6)

The wafer A3 that has been cooled in the cooling module CPL22B is conveyed to the coating module COT23B via the conveyance arm E2 in order to undergo the resist-coating process. Meanwhile, the wafer A4 that has been cooled in the cooling module CPL32B is conveyed to the coating module COT33B via the conveyance arm E3 in order to undergo the resist-coating process.

(Step 7)

The wafer A5 that has been cooled in the cooling module CPL22A is conveyed to the coating module COT23C via the conveyance arm E2 in order to undergo the resist-coating process. Meanwhile, the wafer A6 that has been cooled in the cooling module CPL32A is conveyed to the coating module COT33C via the conveyance arm E3 in order to undergo the resist-coating process.

(Step 8)

The wafer A1 that has been coated in the coating module COT23A is conveyed to the heating module HP24A via the conveyance arm E2. Meanwhile, the wafer A2 that has been coated in the coating module COT33A is conveyed to the heating module HP34A via the conveyance arm E3.

(Step 9)

The wafer A3 that has been coated in the coating module COT23B is conveyed to the heating module HP24B via the conveyance arm E2. Meanwhile, the wafer A4 that has been coated in the coating module COT33B is conveyed to the heating module HP34B via the conveyance arm E3.

(Step 10)

The wafer A5 that has been coated in the coating module COT23C is conveyed to the heating module HP24C via the conveyance arm E2. Meanwhile, the wafer A6 that has been coated in the coating module COT33C is conveyed to the heating module HP34C via the conveyance arm E3.

(Step 11)

The wafer A1 that has been heated in the heating module HP24A is conveyed to the wafer edge exposure module WEE25 via the conveyance arm E2. Meanwhile, the wafer A2 that has been heated in the heating module HP34A is conveyed to the wafer edge exposure module WEE35 via the conveyance arm E3.

(Step 12)

The wafer A1 that has undergone processing in the wafer edge exposure module WEE25 is conveyed to the buffer module BM26 via the conveyance arm E2. Meanwhile, the wafer A2 that has undergone processing in the wafer edge exposure module WEE35 is conveyed to the buffer module BM36 via the conveyance arm E3. After this, the wafer A3 that has been heated in the heating module HP24B is conveyed to the wafer edge exposure module WEE25 via the conveyance arm E2. Meanwhile, the wafer A4 that has been heated in the heating module HP34B is conveyed to the wafer edge exposure module WEE35 via the conveyance arm E3.

(Step 13)

The wafer A1 is conveyed from the buffer module BM26 to the transfer arm D1, the shuttle arm 16, the interface arm I, and the exposure apparatus S4, in that order. Subsequently to this, the wafer A2 is conveyed from the buffer module BM36 to the transfer arm D1, the shuttle arm 16, the interface arm I, and the exposure apparatus S4, in that order. Meanwhile, the wafer A3 that has undergone edge exposure in the wafer edge exposure module WEE25 is conveyed to the buffer module BM26 via the conveyance arm E2. After this, the wafer A5 is conveyed to WEE25. In addition, the wafer A4 that has undergone edge exposure in the wafer edge exposure module WEE35 is conveyed to the buffer module BM36 via the conveyance arm E3. After this, the wafer A6 is conveyed to WEE35.

(Step 14)

The wafer A3 is conveyed to the exposure apparatus S4 via substantially the same route as that of the wafer A1, and subsequently to this conveyance, the wafer A4 is conveyed to the exposure apparatus S4 via substantially the same route as that of the wafer A2. Meanwhile, the wafer A5 that has undergone edge exposure in the wafer edge exposure module WEE25 is conveyed to the buffer module BM26 via the conveyance arm E2. Along with this, the wafer A6 that has undergone edge exposure in the wafer edge exposure module WEE35 is conveyed to the buffer module BM36 via the conveyance arm E3.

Detailed description of the conveyance routes relating to a wafer A7 and subsequent wafers is omitted herein. Only an outline of these conveyance routes is given below. For odd-numbered wafers A, after each wafer has been carried from the carrier C1 into the TRS2 of the COT layer G2, the wafer is conveyed in accordance with the conveyance schedule table of FIG. 5 by the conveyance arm E2 so as to move between the modules predetermined by the controller 10, and is conveyed to the buffer module BM26 while undergoing processing in each module. For even-numbered wafers A, after each wafer has been carried from the carrier C1 into the TRS3 of the COT layer G3, the wafer is conveyed between modules in accordance with the above conveyance schedule table by the conveyance arm E3, and is conveyed to the buffer module BM36 while undergoing processing in each module. In this way, concurrent processing of the wafers A advances in the COT layers G2, G3.

The wafers A that have been conveyed to the buffer modules BM26, BM36 are carried in that order into the exposure apparatus S4 via the transfer arm D1 and the shuttle arm 16. That is to say, the wafers A are loaded from the COT layers G2, G3 into the exposure apparatus S4 alternately in the order that each wafer A has been carried into the COT layer G2 or G3.

Conveyance routes of each wafer which has been exposed to light in the exposure apparatus S4 are next described. Upon completion of the exposure process, the wafer A1 is conveyed to the transfer stage TRS4 via the interface arm I. After this, the wafer A1 is conveyed to the TRS4, the heating module HP41A, the cooling module CPL42A, and the developing module DEV43A, in that order, by the conveyance arm E1, thereby to undergo the developing process. Following the wafer A1, the wafer A2 is unloaded from the exposure apparatus S4 and then conveyed to the TRS5 via the interface arm I. After this, the wafer A2 is conveyed to the heating module HP41B, the cooling module CPL42B, and the developing module DEV43B, in that order, by the conveyance arm E1, thereby to undergo the developing process.

Additionally, following the wafer A2, the wafer A3 is unloaded from the exposure apparatus S4 and then conveyed to the interface arm I, the transfer stage TRS4, the conveyance arm E1, the heating module HP41C, the conveyance arm E1, the cooling module CPL42A, the conveyance arm E1, and the developing module DEV43C, in that order, to undergo the developing process. Although detailed description of the conveyance routes relating to the subsequent wafers unloaded from the exposure apparatus S4 is omitted herein, these wafers are conveyed between specified modules in accordance with the conveyance schedule table of FIG. 6 and then move to the specified DEV modules to undergo the developing process.

Upon completion of the development in the DEV43A, the wafer A1 is conveyed to the heating module HP44A, the TRS6, and the carrier arm 12, in that order, and then conveyed from the carrier arm 12 to the carrier C1. Following this, upon completion of the development in the DEV43B, the wafer A2 is conveyed to the heating module HP44B, the TRS7, and the carrier arm 12, in that order, and then conveyed from the carrier arm 12 to the carrier C1. Furthermore, following this, upon completion of the development in the DEV43C, the wafer A3 is conveyed to the heating module HP44C, the TRS6, the carrier arm 12, and the carrier C1, in that order. Subsequent wafers A, after being developed in the required respective DEV modules, are also each conveyed between predetermined modules and returned to the carrier C1.

In the above coating and developing apparatus 1, wafers that have been sequentially unloaded from the carrier C1 are carried into the COT layers G2, G3 alternately, and the wafers in the COT layers G2, G3 are conveyed concurrently between the plurality of hydrophobizing modules ADH, cooling modules CPL, coating modules COT, and heating modules HP provided in each layer, and are each coated. Next, the wafers sequentially subjected to coating in the layers G2, G3 are loaded into the exposure apparatus S4 in the order that each wafer was carried into the COT layer G. The wafers are further carried into the DEV layer G1, in which each wafer is then developed in order and returned to the carrier C1.

Therefore, compared to the case that a large number of modules of the same kind, such as coating modules and heating modules, are provided in one COT layer, concurrent processing in these modules of the same kind is executed, and concurrent wafer conveyance is executed between different kinds of modules to achieve the desired throughput, wafer conveyance in such a module layout form allows the number of modules in each COT layer G2, G3 to be made smaller, and a moving speed of the conveyance arm E2, E3 in the layers to be suppressed. These features, in turn, minimize wafer-conveying errors such as dropping from the conveyance arms E2, E3, and thus suppress any decreases in wafer-conveying accuracy in the COT layers G2, G3.

An example of conveying a wafer lot following the wafers A in the above coating and developing apparatus 1 is next described. First, as described above, for example, during the unloading of a wafer A from the carrier C1 into the carrier block S1, a carrier C2 that contains wafers B whose lot number differs from that of another wafer A is conveyed to the mounting table 11 of the carrier block S1. Although not shown, a conveyance schedule table relating to the wafers B is set by the controller 10 before each wafer B is carried into the carrier block S1. Next after the wafer A25 that is the last of the wafers A has been carried into the carrier block S1, the wafer B1 that is the first in the lot of the wafers B is carried into the carrier block S1.

Next after the wafer A25 has been conveyed to the COT layer G2 in accordance with the conveyance schedule table of FIG. 5, the wafer B1 is conveyed to the COT layer G3 and coated with the resist. Also, the wafers B2 to B25 that follow are unloaded from the carrier C2 in order of the wafer number, as with the wafers A. Of the wafers B2 to B25, even-numbered ones and odd-numbered ones are conveyed to the COT layers G2 and G3, respectively, to undergo resist-coating. After this, the wafers B following the wafer A 25, as with the wafers A, are conveyed to the exposure apparatus S4 in numerical order, and are subjected to exposure.

During the conveyance of wafers A in the DEV layer G1, when the heating process for the last of the wafers A in one specific heating module HP41A to HP41F of the DEV layer G1 is completed, this heating module changes a temperature of its heat plate, before the wafers B arrive, to a temperature level required for the heating of the wafers B. Specifically, after the heating of the wafer A25 by HP41A, the wafer A20 by HP41B, the wafer A21 by HP41C, the wafer A22 by HP41D, the wafer A23 by HP41E, and the wafer A24 by HP41F are completed on the basis of the conveyance schedule table, the respective heat plates are changed in temperature, and each wafer B is heated at the new temperature. The heated wafers B, as with the wafers A, are next developed and returned to the carrier C2.

In this manner, in the coating and developing apparatus 1, wafers are loaded from the buffer modules BM via the shuttle arm 16 into the exposure apparatus S4 in the order that the wafers have been carried into the carrier block S1, and in this order, the wafers are unloaded from the exposure apparatus S4 into the DEV layer G1. Therefore, the following lot does not outrun the preceding lot. Thus, when a heating parameter of the heating modules HP41A to HP41F for the wafers is changed for each lot, as in the above, even if the wafers of the preceding lot are being conveyed in the apparatus 1, the wafers of the following lot can be conveyed following the wafers of the preceding lot. This offers an advantage in that a decrease in throughput is suppressed.

In the DEV layer G1, a processing parameter of modules other than the heating modules may be changed for each lot. In addition, upon completion of the processing of the wafers A in each module of the COT layers G2, G3, the processing parameters of each module may be modified before the wafers B arrive, and the new processing parameters may be used to process the wafers B.

Second Embodiment

A second embodiment is described below referring to FIGS. 9 and 10. A coating and developing apparatus 6 according to the second embodiment of FIGS. 9 and 10 differs from the coating and developing apparatus 1 according to the above first embodiment in that a COT layer G4 constructed similarly to the COT layers G2, G3 is stacked on the COT layer G3.

Figure 9:
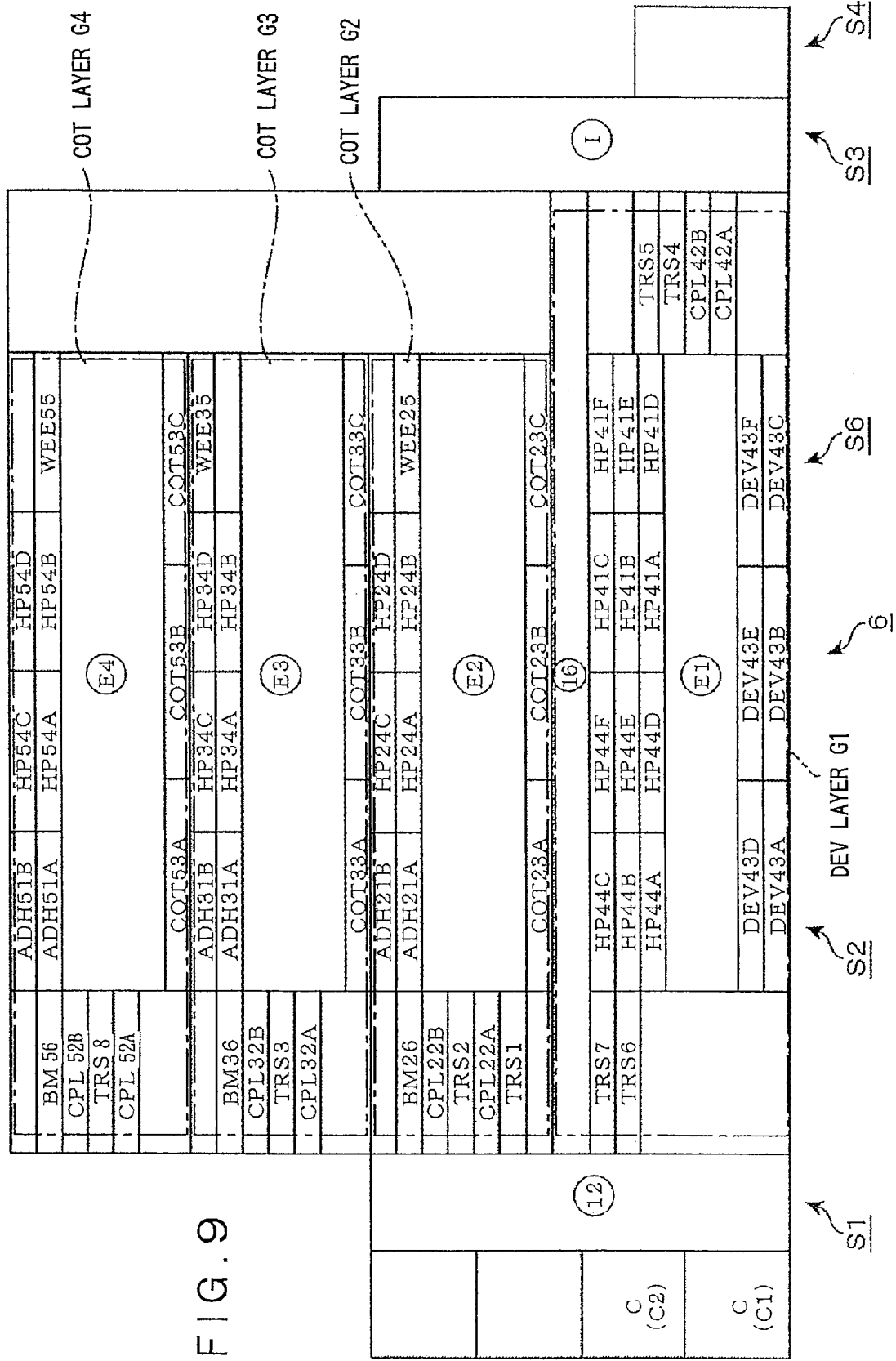
FIG. 9 is a schematic diagram that shows various modules included in a coating and developing apparatus of a second embodiment.
Figure 10:
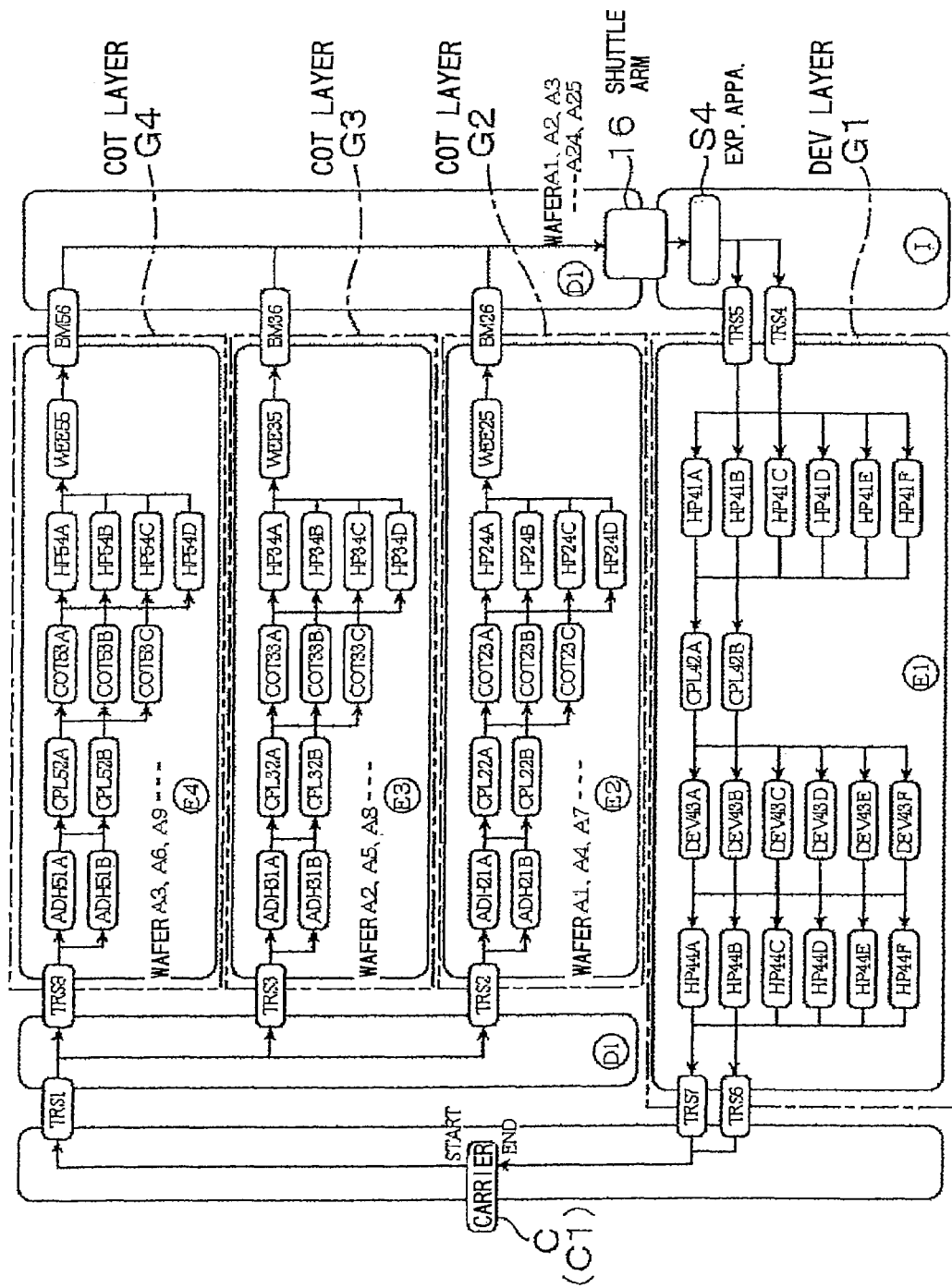
FIG. 10 is a flow diagram that shows wafer conveyance between the modules in the coating and developing apparatus of the second embodiment.

As shown in FIGS. 9, 10, the COT layer G4 includes ADH modules 51A, 51B, COT modules 53A to 53C, heating modules 54A to 54D, a WEE module 55, and a conveyance arm E4, at positions equivalent to those of the ADH modules 21A, 21B, COT modules 23A to 23C, heating modules 24A to 24D, WEE module 25, and conveyance arm E2 of the COT layer G2.

In addition, in positions of the shelf unit U5 that are equivalent to those of the COT layer G4, cooling module CPL52A, a transfer stage TRS8, cooling module CPL52B, and a buffer module BM56 are provided in stacked form in that order from below. These modules are equivalent to those of the CPL32A, CPL32B, TRS3, and BM36 of the COT layer G3, and the transfer arm D1 can transfer wafers to each of the modules.

In the coating and developing apparatus 6, wafers A that have been conveyed from the carrier C1 in numerical order are cyclically conveyed to the COT layers G2, G3, G4, in that order. For example, when wafers A1, A2, A3 are conveyed to the COT layers G2, G3, G4, respectively, wafers A4, A5, A6 will be next conveyed to the COT layers G2, G3, G4, respectively.

Next, the wafers A are conveyed to ADH, CPL, COT, HP, and WEE modules, in that order, in the COT layers G2 to G4, then processed in these modules, and conveyed to the buffer modules BM. After this, the transfer arm D1 and the shuttle arm 16 sequentially load the wafers A into the exposure apparatus S4 in order of unloading from the carrier C1, that is, in numerical order. Upon completion of exposure, each wafer A that has been loaded into the exposure apparatus S4 is returned to the carrier C1 via the DEV layer G1, as in the coating and developing apparatus 1. In this coating/developing apparatus construction, since the number of modules included in one COT layer can also be minimized, substantially the same advantageous effects as those of the coating and developing apparatus 1 can be obtained.

Third Embodiment

Figure 11:
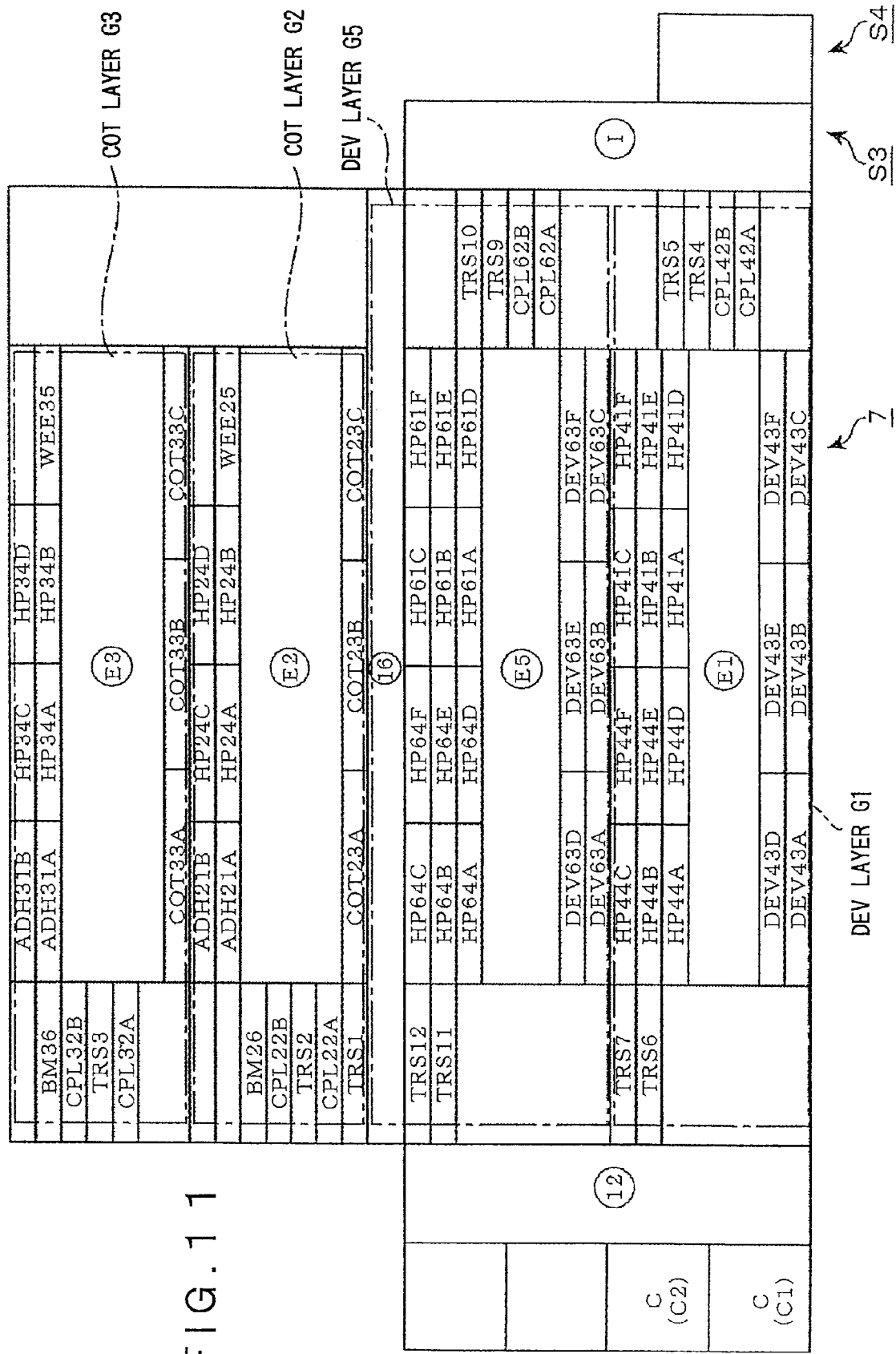
FIG. 11 is a schematic diagram that shows various modules included in a coating and developing apparatus of a third embodiment.
Figure 12:
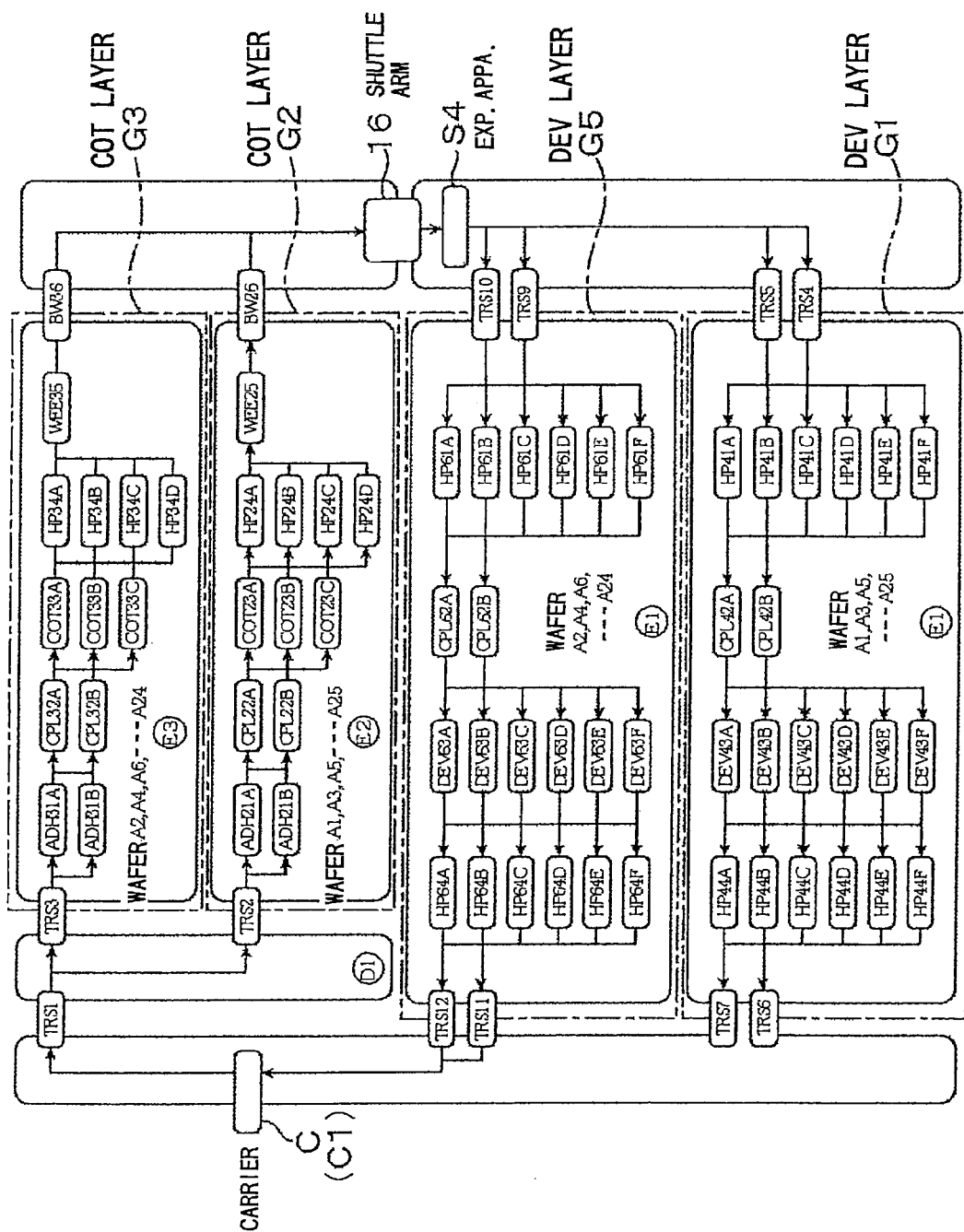
FIG. 12 is a flow diagram that shows wafer conveyance between the modules in the coating and developing apparatus of the third embodiment.
Figure 13:
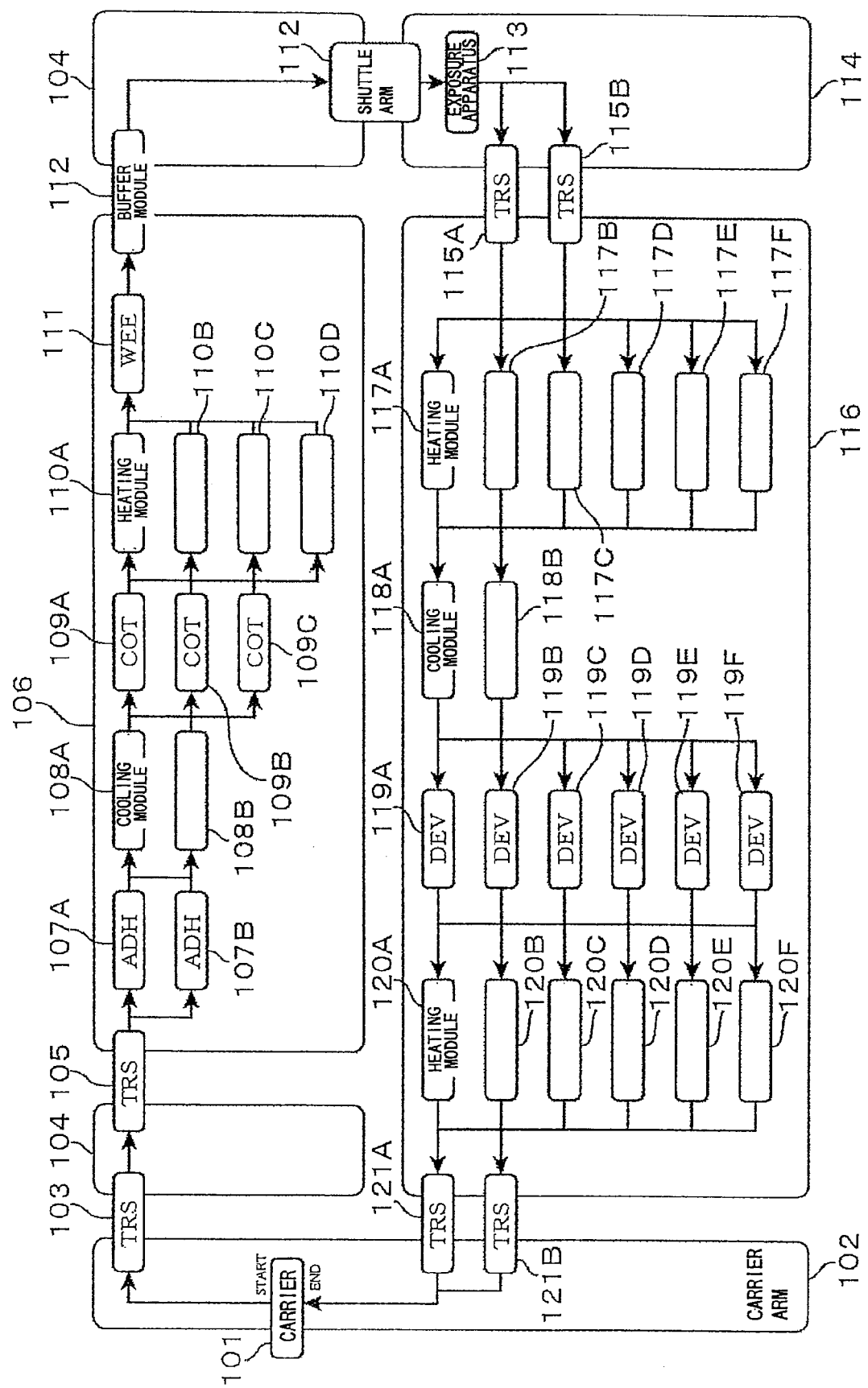
FIG. 13 is a flow diagram that shows wafer conveyance in a conventional coating and developing apparatus.

A coating and developing apparatus 7 that is a third embodiment is described below referring to FIGS. 11 and 12. The coating and developing apparatus 7 according to the third embodiment, shown in FIGS. 11 and 12, includes a DEV layer G5 between the COT layer G2 and the DEV layer G1.

The DEV layer G5 is substantially of the same configuration as that of the DEV layer G1, and includes HP modules 61A to 61F, HP modules 64A to 64F, and a conveyance arm E5 at respective positions equivalent to those of the above-described HP modules 41A to 41F, HP modules 44A to 44F, and conveyance arm E1.

In addition, in positions of the shelf unit U6 that are equivalent to those of the COT layer G5, CPL62A, CPL62B, TRS9, and TRS10 equivalent to the CPL42A, CPL42B, TRS4, and TRS5, respectively, of the DEV layer G1, are provided in stacked form in that order from below. Furthermore, the interface arm I can convey wafers W to the above modules. Besides, in this example, the shuttle arm 16 is provided in the DEV layer G5.

As in the first embodiment, wafers A that have been unloaded from the carrier C1 and resist-coated in each COT layer are exposed to light and then conveyed to the DEV layer G1 or G5 alternately. For example, odd-numbered wafers A that consist of wafers A1, A3, A5, etc. up to A25, are conveyed to the TRS4 or TRS5 of the DEV layer G1. Also, even-numbered wafers A that consist of wafers A2, A4, A6, etc. up to A24, are conveyed to the TRS9 or TRS10 of the DEV layer G5.

The wafers A that have been conveyed to the TRS4 or TRS5 of the DEV layer G1 are conveyed in substantially the same way as in the first embodiment, whereas the wafers A that have been conveyed to the TRS9 or TRS10 of the DEV layer G5 are conveyed between various sections by taking a route of either HP module from 61A to 61F, the CPL module 62A or 62B, either DEV module from 63A to 63F, either HP module from 64A to 64F, and the TRS stage 11 or 12. The conveyance arms E1, E5 in the DEV layers G1, G5 convey the wafers A independently of each other. The wafers A that have been conveyed to TRS6, TRS7, TRS11, or TRS12 are returned to the carrier C1 via the carrier arm 12.

In the present embodiment, wafers are thus conveyed concurrently between the modules included in the plurality of DEV layers. Accordingly, compared with a configuration with a large number of modules of the same kind in one DEV layer, loads upon the conveyance arms for conveying each wafer between modules can be reduced while suppressing decreases in throughput, and wafer-conveying accuracy in the DEV layers can be improved. Even when a plurality of DEV layers are provided, more than two COT layers can be provided. In addition, when wafers of a following lot are conveyed, as in the first embodiment, a processing parameter of each module may be changed before the wafers of the following lot arrive.

While, in each embodiment described above, each wafer before being resist-coated is subjected to hydrophobizing, a process for forming an anti-reflection film may replace the hydrophobizing.

What is claimed is:

1. A coating and developing apparatus, comprising:
    a carrier block into which substrates are carried by a carrier;
    a processing block to and from which the substrates that have been carried into the carrier block are transferred, the processing block forming a film coating, inclusive of a resist film, upon the substrates; and
    an interface block for conveying to an optical exposure apparatus the substrates each having the film coating formed thereon by the processing block;
    wherein:
    the processing block includes a plurality of resist-film forming blocks each extending from a direction of the carrier block, towards the interface block, and a developing block extending from the direction of the carrier block, towards the interface block;
    conveyance means for substrate loading into the processing block is provided in the carrier block, the conveyance means for substrate loading adapted to convey the substrates from the carrier to the resist-film forming blocks;
    conveyance means for substrate loading into the exposure apparatus is provided in the interface block, the conveyance means for substrate loading adapted to convey the substrates to the exposure apparatus and after unloading the substrates therefrom, convey the substrates to the developing block;
    the conveyance means for substrate loading into the processing block conveys the substrates from the carrier, one at a time, to each resist-film forming block sequentially and periodically, and the conveyance means for substrate loading into the exposure apparatus loads the substrates from each resist-film forming block into the exposure apparatus in the sequence that each substrate has been conveyed to each resist-film forming block by the processing block loading conveyance means.

2. The coating and developing apparatus according to claim 1, wherein each resist-film forming block and the developing block are stacked in layer form upon each other.

3. The coating and developing apparatus according to claim 2, wherein:
    the resist-film forming block is provided in two places; and
    the processing block loading conveyance means conveys the substrates from the carrier, one at a time, in alternate form to each resist-film forming block, and the exposure apparatus loading conveyance means loads the substrates within each resist-film forming block into the exposure apparatus alternately in order of loading from the carrier into the resist-film forming block.

4. The coating and developing apparatus according to claim 3, wherein:
    the developing block is provided in a plurality of places; and
    the exposure apparatus loading conveyance means periodically conveys the exposed substrates, one by one, from the exposure apparatus to each developing block.

5. The coating and developing apparatus according to claim 4, wherein each resist-film forming block includes:
    a plurality of coating modules each for coating each substrate with a resist;
    a plurality of heating modules each for heating the substrate; and
    a plurality of cooling modules each for cooling the substrate.

6. The coating and developing apparatus according to claim 3, wherein each resist-film forming block includes:
    a plurality of coating modules each for coating each substrate with a resist;
    a plurality of heating modules each for heating the substrate; and
    a plurality of cooling modules each for cooling the substrate.

7. The coating and developing apparatus according to claim 2, wherein:
    the developing block is provided in a plurality of places; and
    the exposure apparatus loading conveyance means periodically conveys the exposed substrates, one by one, from the exposure apparatus to each developing block.

8. The coating and developing apparatus according to claim 7, wherein each resist-film forming block includes:
    a plurality of coating modules each for coating each substrate with a resist;
    a plurality of heating modules each for heating the substrate; and
    a plurality of cooling modules each for cooling the substrate.

9. The coating and developing apparatus according to claim 2, wherein each resist-film forming block includes:
    a plurality of coating modules each for coating each substrate with a resist;
    a plurality of heating modules each for heating the substrate; and
    a plurality of cooling modules each for cooling the substrate.

10. The coating and developing apparatus according to claim 1, wherein:
    the resist-film forming block is provided in two places; and
    the processing block loading conveyance means conveys the substrates from the carrier, one at a time, in alternate form to each resist-film forming block, and the exposure apparatus loading conveyance means loads the substrates within each resist-film forming block into the exposure apparatus alternately in order of loading from the carrier into the resist-film forming block.

11. The coating and developing apparatus according to claim 10, wherein:
    the developing block is provided in a plurality of places; and
    the exposure apparatus loading conveyance means periodically conveys the exposed substrates, one by one, from the exposure apparatus to each developing block.

12. The coating and developing apparatus according to claim 11, wherein each resist-film forming block includes:

a plurality of coating modules each for coating each substrate with a resist;
a plurality of heating modules each for heating the substrate; and
a plurality of cooling modules each for cooling the substrate.

13. The coating and developing apparatus according to claim 10, wherein each resist-film forming block includes:
a plurality of coating modules each for coating each substrate with a resist;
a plurality of heating modules each for heating the substrate; and
a plurality of cooling modules each for cooling the substrate.

14. The coating and developing apparatus according to claim 1, wherein:
the developing block is provided in a plurality of places; and
the exposure apparatus loading conveyance means periodically conveys the exposed substrates, one by one, from the exposure apparatus to each developing block.

15. The coating and developing apparatus according to claim 14, wherein each resist-film forming block includes:
a plurality of coating modules each for coating each substrate with a resist;
a plurality of heating modules each for heating the substrate; and
a plurality of cooling modules each for cooling the substrate.

16. The coating and developing apparatus according to claim 1, wherein each resist-film forming block includes:
a plurality of coating modules each for coating each substrate with a resist;
a plurality of heating modules each for heating the substrate; and
a plurality of cooling modules each for cooling the substrate.

17. A coating and developing method using a coating and developing apparatus to coat substrates with a resist and to develop the substrates after exposure thereof to light, wherein:
the coating and developing apparatus includes
a carrier block into which substrates are carried by a carrier;
a processing block to and from which the substrates that have been carried into the carrier block are transferred, the processing block forming a film coating, inclusive of a resist film, upon the substrates, and
an interface block for conveying to an optical exposure apparatus the substrates each having the film coating formed thereon by the processing block;
the processing block includes a plurality of resist-film forming blocks each extending from a direction of the carrier block, towards the interface block, and a developing block extending from the direction of the carrier block, towards the interface block;
conveyance means for substrate loading into the processing block is provided in the carrier block, the conveyance means for substrate loading adapted to convey the substrates from the carrier to the resist-film forming blocks;
conveyance means for substrate loading into the exposure apparatus is provided in the interface block, the conveyance means for substrate loading adapted to convey the substrates to the exposure apparatus and after unloading the substrates therefrom, convey the substrates to the developing block; and
the coating and developing method comprises the steps of
using the processing block loading conveyance means to convey the substrates, one at a time, from the carrier to each resist-film forming block sequentially and periodically, and
using the exposure apparatus loading conveyance means to load the substrates from the resist-film forming blocks into the exposure apparatus in the sequence that each substrate has been conveyed to each resist-film forming block by the processing block loading conveyance means.

18. The coating and developing method according to claim 17, wherein:
the resist-film forming block is provided in two places; and
the processing block loading conveyance means conveys the substrates from the carrier, one at a time, in alternate form to each resist-film forming block, and the exposure apparatus loading conveyance means loads the substrates within each resist-film forming block into the exposure apparatus alternately in order of loading from the carrier into the resist-film forming block.

19. The coating and developing method according to claim 18, wherein:
the developing block is provided in a plurality of places; and
the coating and developing method further comprises the step of using the exposure apparatus loading conveyance means to, periodically convey the exposed substrates, one by one, from the exposure apparatus to each developing block.

20. The coating and developing method according to claim 17, wherein:
the developing block is provided in a plurality of places; and
the coating and developing method further comprises the step of using the exposure apparatus loading conveyance means to, periodically convey the exposed substrates, one by one, from the exposure apparatus to each developing block.

21. A storage medium within which a computer program operating on a computer is stored, the storage medium being used for a coating and developing method which activates a coating and developing apparatus to coat substrates with a resist and to develop the substrates after exposure thereof to light, wherein:
the coating and developing apparatus includes
a carrier block into which substrates are carried by a carrier;
a processing block to and from which the substrates that have been carried into the carrier block are transferred, the processing block forming a film coating, inclusive of a resist film, upon the substrates, and
an interface block for conveying to an optical exposure apparatus the substrates each having the film coating formed thereon by the processing block;
the processing block includes a plurality of resist-film forming blocks each extending from a direction of the carrier block, towards the interface block, and a developing block extending from the direction of the carrier block, towards the interface block;
conveyance means for substrate loading into the processing block is provided in the carrier block, the conveyance means for substrate loading adapted to convey the substrates from the carrier to the resist-film forming blocks;
conveyance means for substrate loading into the exposure apparatus is provided in the interface block, the conveyance means for substrate loading adapted to convey the substrates to the exposure apparatus and after unloading the substrates therefrom, convey the substrates to the developing block; and the coating and developing method comprises the steps of
using the processing block loading conveyance means to convey the substrates, one at a time, from the carrier to each resist-film forming block sequentially and periodically, and using the exposure apparatus loading conveyance means to load the substrates from the resist-film forming blocks into the exposure apparatus in the sequence that each substrate has been conveyed to each resist-film forming block by the processing block loading conveyance means.

* * * * *